(12) United States Patent
Nguyen et al.

(10) Patent No.: US 8,337,950 B2
(45) Date of Patent: Dec. 25, 2012

(54) METHOD FOR DEPOSITING BORON-RICH FILMS FOR LITHOGRAPHIC MASK APPLICATIONS

(75) Inventors: Victor Nguyen, Novato, CA (US); Yi Chen, Sunnyvale, CA (US); Mihaela Balseanu, Sunnyvale, CA (US); Isabelita Roflox, Union City, CA (US); Li-Qun Xia, Cupertino, CA (US); Derek R Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 343 days.

(21) Appl. No.: 12/786,245

(22) Filed: May 24, 2010

(65) Prior Publication Data

US 2010/0233633 A1    Sep. 16, 2010

Related U.S. Application Data

(63) Continuation-in-part of application No. 11/765,257, filed on Jun. 19, 2007, now Pat. No. 8,084,105.

(51) Int. Cl.
*C23C 16/38* (2006.01)
*C23C 16/30* (2006.01)

(52) U.S. Cl. ......... 427/249.5; 427/255.38; 427/255.394; 427/255.7

(58) Field of Classification Search ............ 427/249.5, 427/255.38, 255.394, 255.7
See application file for complete search history.

(56) References Cited

U.S. PATENT DOCUMENTS

| | | | |
|---|---|---|---|
| 3,451,840 A | 6/1969 | Hough | |
| 4,440,828 A | 4/1984 | Resneau et al. | |
| 4,656,052 A | 4/1987 | Satou et al. | |
| 5,171,708 A | 12/1992 | Katayama et al. | 437/160 |
| 5,270,125 A | 12/1993 | America et al. | |
| 5,306,530 A | 4/1994 | Strongin et al. | |
| 5,328,810 A | 7/1994 | Lowrey et al. | |
| 5,483,920 A * | 1/1996 | Pryor | 117/106 |
| 5,518,780 A * | 5/1996 | Tamor et al. | 427/573 |
| 5,534,070 A | 7/1996 | Okamura et al. | |
| 5,536,360 A | 7/1996 | Nguyen et al. | |
| 5,558,908 A | 9/1996 | Lukacs, III et al. | |

(Continued)

FOREIGN PATENT DOCUMENTS

JP    7-258822    * 10/1995

(Continued)

OTHER PUBLICATIONS

Lee, Sunwoo, et al., "Characterization of boron carbide thin films fabricated by plasma enhanced chemical vapor deposition from boranes." J. Appl. Phys. 72 (10), Nov. 15, 1992, pp. 4925-4933.*

(Continued)

*Primary Examiner* — Bret Chen
(74) *Attorney, Agent, or Firm* — Degosits & Noah LLP

(57) ABSTRACT

Methods for processing a substrate with a boron rich film are provided. A patterned layer of boron rich material is deposited on a substrate and can be used as an etch stop. By varying the chemical composition, the selectivity and etch rate of the boron rich material can be optimized for different etch chemistries. The boron rich materials can be deposited over a layer stack substrate in multiple layers and etched in a pattern. The exposed layer stack can then be etched with multiple etch chemistries. Each of the boron rich layers can have a different chemical composition that is optimized for the multiple etch chemistries.

17 Claims, 11 Drawing Sheets

U.S. PATENT DOCUMENTS

| | | | |
|---|---|---|---|
| 5,626,922 | A | 5/1997 | Miyanaga et al. |
| 5,837,607 | A | 11/1998 | Quick |
| 5,897,751 | A | 4/1999 | Makowiecki et al. |
| 5,952,677 | A | 9/1999 | Park .............................. 257/66 |
| 5,994,762 | A | 11/1999 | Suwanai et al. |
| 6,025,611 | A * | 2/2000 | Dowben ...................... 257/183 |
| 6,165,551 | A | 12/2000 | Lukacs et al. ................ 427/278 |
| 6,194,321 | B1 * | 2/2001 | Moore et al. .................. 438/706 |
| 6,228,731 | B1 | 5/2001 | Liaw et al. .................... 438/303 |
| 6,531,377 | B2 | 3/2003 | Knorr et al. |
| 6,759,261 | B2 | 7/2004 | Shimokohbe et al. |
| 6,924,191 | B2 | 8/2005 | Liu et al. |
| 6,958,175 | B2 | 10/2005 | Sakamoto et al. |
| 7,064,078 | B2 | 6/2006 | Liu et al. |
| 7,081,414 | B2 | 7/2006 | Zhang et al. |
| 7,115,525 | B2 | 10/2006 | Abatchev et al. |
| 7,144,803 | B2 * | 12/2006 | Engbrecht et al. ........... 438/622 |
| 7,205,240 | B2 | 4/2007 | Karim et al. |
| 7,704,816 | B2 * | 4/2010 | Huh et al. .................... 438/197 |
| 8,084,105 | B2 * | 12/2011 | Huh et al. .................... 427/576 |
| 8,148,269 | B2 * | 4/2012 | Balseanu et al. ............. 438/706 |
| 2002/0197823 | A1 | 12/2002 | Yoo et al. |
| 2003/0082296 | A1 | 5/2003 | Elers et al. |
| 2003/0224217 | A1 | 12/2003 | Byun et al. |
| 2004/0058199 | A1 | 3/2004 | Sakamoto et al. ........... 428/698 |
| 2004/0083973 | A1 * | 5/2004 | Sakamoto et al. ..... 118/723.001 |
| 2004/0175932 | A1 | 9/2004 | Kim et al. |
| 2004/0259353 | A1 * | 12/2004 | Engbrecht et al. ........... 438/687 |
| 2005/0048801 | A1 | 3/2005 | Karim et al. |
| 2005/0208218 | A1 | 9/2005 | Becker et al. ............. 427/248.1 |
| 2006/0019486 | A1 | 1/2006 | Yu et al. |
| 2006/0147282 | A1 | 7/2006 | Bello et al. .................... 407/119 |
| 2006/0207504 | A1 | 9/2006 | Hasebe et al. |
| 2006/0289951 | A1 | 12/2006 | Weimer |
| 2007/0049040 | A1 | 3/2007 | Bai et al. |
| 2007/0141384 | A1 * | 6/2007 | Ulrich et al. .................. 428/627 |
| 2007/0197028 | A1 | 8/2007 | Byun et al. |
| 2008/0292798 | A1 | 11/2008 | Huh et al. ...................... 427/343 |
| 2008/0299776 | A1 | 12/2008 | Bencher et al. |
| 2009/0017640 | A1 | 1/2009 | Huh et al. ...................... 438/783 |
| 2009/0263972 | A1 | 10/2009 | Balseanu et al. ............. 438/696 |
| 2010/0098884 | A1 | 4/2010 | Balseanu et al. ............. 427/577 |
| 2010/0099236 | A1 | 4/2010 | Kwon et al. |

FOREIGN PATENT DOCUMENTS

| | | |
|---|---|---|
| KR | 1020060113162 | 11/2006 |
| KR | 1020070099933 | 10/2007 |

OTHER PUBLICATIONS

Guo, L., et al., "Growth of Boron-Rich Nanowires by Chemical Vapor Deposition (CVD)". Journal of Nanomaterials, vol. 2006, Article ID 58237, pp. 1-6.*

Bath, A., et al., "Plasma enhanced chemical vapour deposition of boron nitride onto InP". Thin Solid Films, 241 (1994) 278-281.*

English abstract of JP 7-258822.*

Ferguson, J.D. et al., "Atomic layer depostion of boron nitride using sequential exposures of $BCl_3$ and $NH_3$". Thin Solid Films 413 (2002), pp. 16-25.

Wank, Jeffrey R., et al., "Nanocoating individual cohesive boron nitride particles in a fluidized bed by ALD". Powder Technology 142 (2004), pp. 59-69.

PCT International Search Report dated Oct. 1, 2008 for International Application No. PCT/US08/69218.

PCT International Search Report for International Application No. PCT/US2009/039356.

PCT International Search Report dated Aug. 8, 2008 for International Application No. PCT/US08/63552.

PCT International Search Report for International Application No. PCT/US2009/058832.

"*International Search Report*", mailed Feb. 9, 2012, PCT/US2011/037295.

* cited by examiner

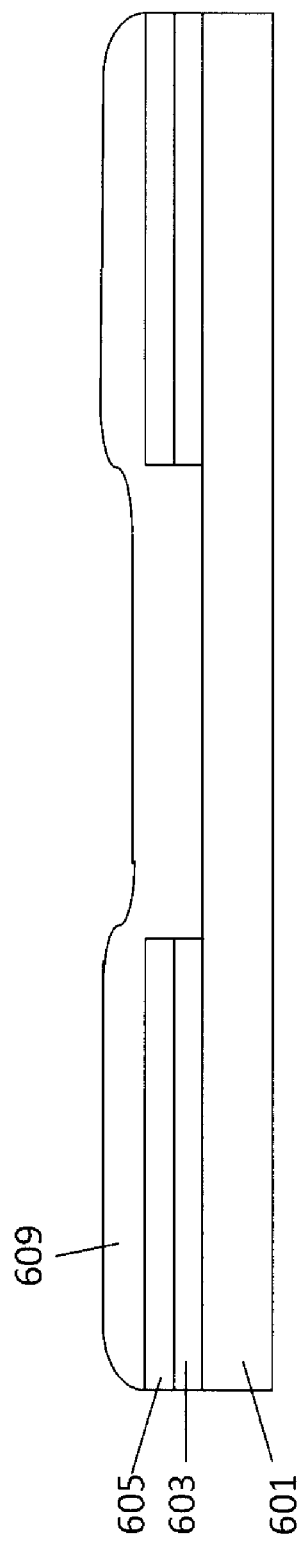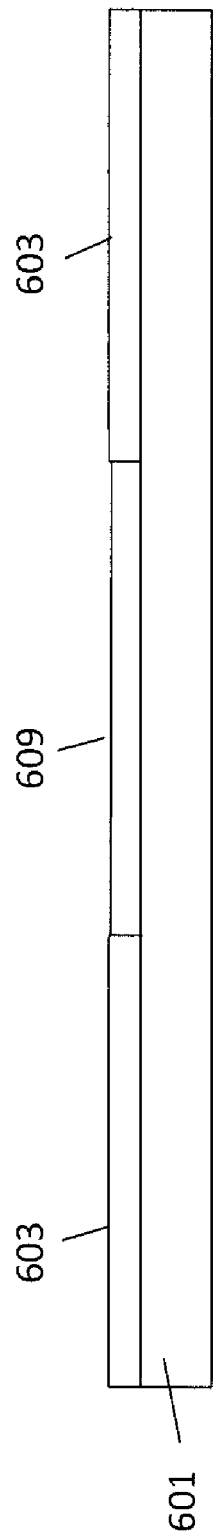

METHOD FOR DEPOSITING BORON-RICH FILMS FOR LITHOGRAPHIC MASK APPLICATIONS

CROSS REFERENCE TO RELATED APPLICATIONS

This application is a continuation-in-part of U.S. patent application Ser. No. 11/765,257, filed Jun. 19, 2007 now U.S. Pat. No. 8,084,105, "BORON NITRIDE AND BORON NITRIDE-DERIVED MATERIALS DEPOSITION METHOD" which is hereby incorporated by reference.

BACKGROUND OF THE INVENTION

1. Field of the Invention

Embodiments of the present invention generally relate to methods of forming films on substrates, such as semiconductor substrates. More particularly, embodiments of the present invention relate to methods for forming boron rich films on substrates.

2. Description of the Related Art

Integrated circuit geometries have dramatically decreased in size since such devices were first introduced several decades ago. Since then, integrated circuits have generally followed the two year/half size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

Amorphous boron films have been used in semiconductor processing for various purposes. Amorphous boron has good mechanical properties, excellent step coverage, good wet etch resistance and a high dry etch selectivity for low dielectric films. All of these characteristics are beneficial for applications such as lithographic hard masks to low-k dielectric etching and self-aligned double-patterning processes. However, a problem with amorphous boron is that it tends to have a high film stress which causes line bending and damage the integrated circuit.

SUMMARY OF THE INVENTION

Embodiments of the present invention generally provide methods of depositing a boron-rich films on a substrate through a chemical vapor deposition (CVD) process. Boron rich films have been found to have many of the beneficial characteristics such as good mechanical properties, excellent step coverage, good wet etch resistance and other properties that are similar to amorphous boron. Many of the boron rich film physical characteristics are tunable and controlled by the deposition process.

In an embodiment, boron films are deposited on a substrate through CVD processing. A boron containing precursor is introduced into a CVD processing chamber. The substrate and precursors are heated to a temperature above 300° C. A thermal reaction occurs to the boron containing precursor above 300° C. The thermal reaction causes a boron-rich film to be deposited on the substrate. The composition of the deposited boron rich layer can vary with different percentages of boron and additives.

In other embodiments hydrogen can be added to the boron material. In order to add hydrogen, the boron containing precursor can include hydrogen. An example of a suitable boron containing precursor is $B_2H_6$. The boron-rich film may also include hydrogen, oxygen, carbon, nitrogen and phosphorous. By altering the concentrations of the chemical components, the physical properties of the deposited boron rich layer can be controlled.

In order to control the final composition of the boron layer, the deposition conditions are controlled. The deposition conditions include: precursor flow rates, temperature, plasma power and other process chamber parameters. The reactive precursors will also control the boron composition and can be combined with dilutants such as $N_2$, $H_2$, Ar, He or any combination of these gases. By controlling the relative concentrations of the different film components, the physical characteristics of the boron film can be optimized for the specific application. For example, in an embodiment, the deposited boron film can be patterned and used a hard mask during semiconductor processing. In the hard mask embodiment, the boron content is greater than 60% and the content of other additives such as hydrogen can be less than 5%.

In preferred embodiments, the following CVD deposition process conditions are used. The boron containing precursor can be $B_2H_6$ and the flow rate into the CVD chamber can be between 10 sccm to 10 slm. The process gas dilutants can be $N_2$ and Ar and the flow rates for each are between 200 sccm to 20 slm. The pressure within the CVD chamber is between 10 mT to 760 T and the pedestal temperature is between 25° C. to 550° C.

The boron rich film has very good step coverage and can be deposited over a substrate having a non-planar surface. After deposition, the boron rich layer can be etched in a pattern. A photo resist film is deposited on the boron rich film and patterned with a lithography process. A dry etch process is then used to etch the desired pattern into the boron rich layer. After the boron rich layer is etched, the photo resist layer is removed with an ashing process and the patterned boron rich layer can be cleaned with a wet clean process. The etched boron rich layer can be used as a patterned hard mask for etching of the underlying substrate. For example, underlying material layers for etching can include: dielectric materials (silicon oxide, silicon nitride, low-k materials), metals (copper, aluminum, tungsten) and polysilicon.

In some embodiments, the boron rich film can be comprised of multiple different layers of boron. Each layer can be deposited in the manner described. Each layer can have the same chemical composition and boron concentration. Alternatively, each boron rich layer can have a different chemical composition. The chemical composition is related to the selectivity compared to different etch materials. Thus, if the underlying substrate to be etched is a layer stack of different materials, the boron rich material may have corresponding layers that are optimally selective for each of the underlying layers. For example, if the substrate is a layer stack that includes polysilicon covered by silicon nitride which both need to be etched, the boron rich hard mask may include an upper layer that is highly selective relative to silicon nitride and a lower layer that is highly selective to polysilicon. When etch processing is performed, a first etch chemistry is used for the exposed silicon nitride and a second etch chemistry is used for the polysilicon. The upper boron rich layer is highly selective towards silicon nitride will be exposed to the first etch chemistry. The first etch chemistry will etch the silicon nitride and will also etch the upper layer of the boron film. When the first etch is complete and the polysilicon layer is exposed, the second etch chemistry is used. The lower boron rich layer which is highly selective to polysilicon can be exposed to the second etch chemistry during the second etch. After the etch processing is completed, the boron layers can be removed and the substrate can be cleaned. In other embodiments, the remaining boron material can be used in the device and is not removed from the substrate. In general, boron rich films that have a higher boron content will tend to be more resistant to etching with amorphous boron having the highest etch resistance.

In other embodiments, the boron layer can be removed in a CMP process. For example, the boron rich layer can cover a dielectric layer. A lithography process can be used to pattern the boron layer and then the patterned boron layer can be used as a hard mask for etching the dielectric layer. After an underlying dielectric layer(s) is etched, a conductive material such as copper can be deposited in the etched trenches. After the metal deposition, the boron layer and metal layer can be planarized with a CMP process so that the deposited metal is flush with the dielectric layer. Additional processing can be performed to complete the device including ultra violet (UV) curing or plasma processing to mitigate stress in the boron rich film.

BRIEF DESCRIPTION OF THE DRAWINGS

FIGS. 13-17 illustrate a boron rich layer used as a CMP stop layer.

DETAILED DESCRIPTION

The present invention is directed towards the deposition of a boron rich layer on a substrate for use in a semiconductor device. The boron rich layers can be used as a hard mask that may be sacrificial or left in structures after patterning. For example, the boron rich films that are hard masks for etching oxide, nitride, silicon, polysilicon or metal layers.

In addition to boron, the boron rich films can also include hydrogen, oxygen, carbon, nitrogen and phosphorus. In the test samples, the hydrogen and other additive concentrations varied from less than 1% to 10%. By varying the concentrations of the additives, the physical properties of the boron rich layer can be controlled. For example, the hardness (HD) of the boron rich tends to increase with the percentage of boron. The Young's modulus (MOD) ranges also tends to increase with the percentage of boron.

The boron rich films have a high step coverage and low pattern loading effect. As defined herein, films with a high step coverage have a lower percentage of film thickness difference between different surfaces of a feature, i.e., sidewalls, top, and bottom, than films with low step coverage. The pattern loading effect (PLE) is defined as the percentage of film thickness difference between a film thickness on portion, such as the bottom, top, or sidewall, of a feature in a substrate region with a few features (an isolated area) and a film thickness on a corresponding portion of a feature in a substrate region with high density of features (a dense area), and thus, a lower pattern loading effect percentage reflects a higher film thickness uniformity across a substrate. The step coverage for the boron rich layer is greater than 90% and the pattern load effect (PLE) is less than 5% for almost all of the boron nitrogen layers. These characteristics are very good and identical to amorphous boron.

Figure 1:
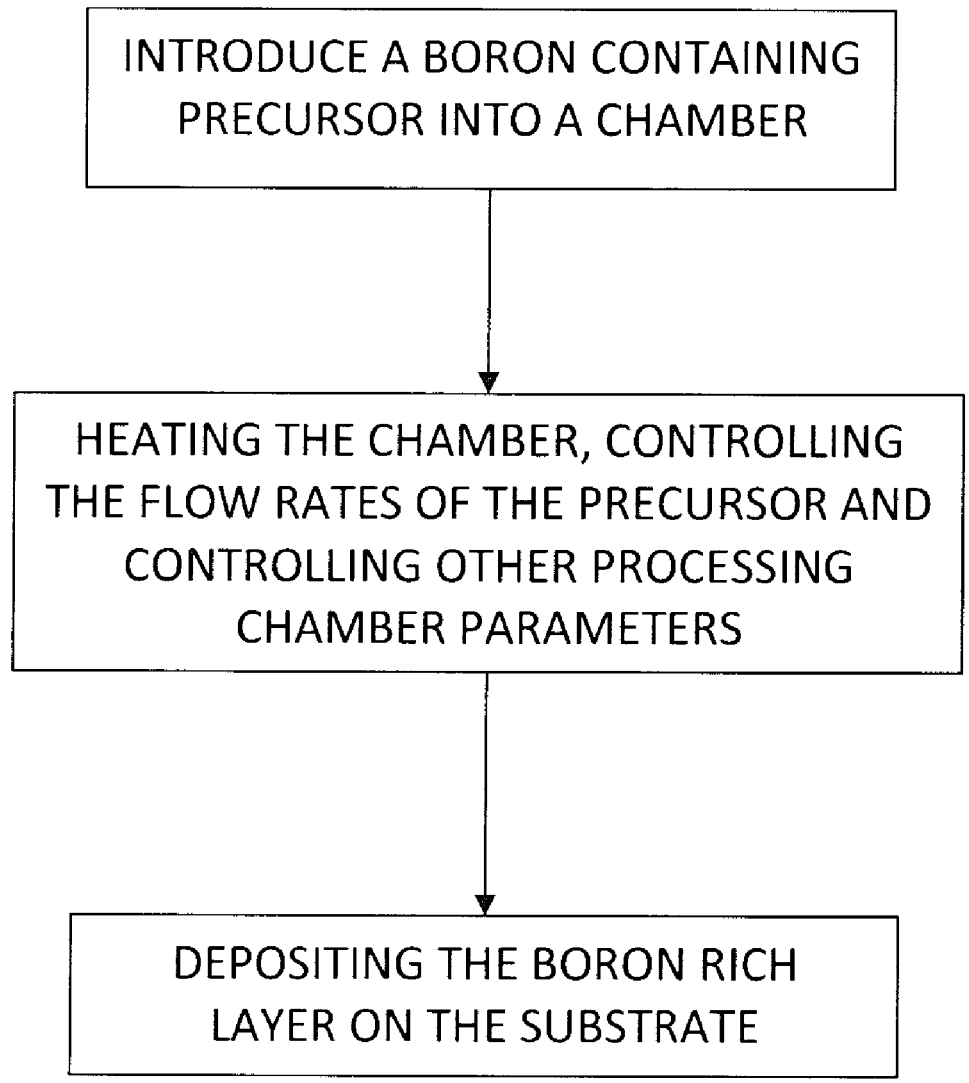
FIG. 1 is a flow chart of the process for forming the boron rich layer.

Specific processes are used to deposit the boron rich layer onto a substrate in a chemical vapor deposition (CVD) processing chamber. FIG. 1 is a flow chart illustrating the basic process steps used to deposit the boron rich layer. The boron containing precursor is introduced into a CVD processing chamber 102. The operating conditions of the CVD processing chamber are controlled by heating the chamber, controlling the flow rates of the boron containing precursor and controlling the other processing chamber parameters 104. A thermal reaction occurs to the boron containing precursor and any additives such as hydrogen, oxygen, carbon, nitrogen and phosphorus. The thermal reaction causes the boron rich film to be deposited on the substrate 106. The boron rich film may be deposited on the substrate in the chamber in the absence of a plasma in the CVD chamber.

When the boron rich film is deposited in the absence of a plasma in the chamber, the temperature of a substrate support in the chamber may be set to between about 25° C. and about 650° C., and the pressure in the chamber may be between about 10 mTorr and about 760 Torr, during the deposition. The base substrate on which the boron rich film is deposited may be silicon, silicon containing material, glass or any other suitable substrate material. The substrate may have one or more layers of material deposited thereon and/or features formed therein. A boron rich layer can be deposited over these layers.

In order to deposit the boron rich layer, a boron containing precursor is introduced into the chamber. The boron containing precursor can be $B_2H_6$ and the flow rate can be 10 sccm to 10 slm. In addition to the precursor gas, additives such as hydrogen, oxygen, carbon, nitrogen and phosphorus can also be introduced into the chamber. Dilution gases can also be introduced into the processing chamber. For example, a dilution gas can be $N_2$ which can be introduced at a flow rate of 200 sccm to 20 slm. An additional dilution gas can be Ar which can have a flow rate of 200 sccm to 20 slm. During the boron rich deposition process, the chamber pressure can be 10 mT to 760 T. The deposition rate for the boron rich material can range from about 400 to 1,450 Å/min In other embodiments, the boron rich film is deposited in the presence of a plasma in a plasma enhanced chemical vapor deposition (PECVD) chamber, the temperature of a substrate support in the chamber may be set to between about 100° C. and about 1,000° C., and the pressure in the chamber may be between about 10 mTorr and about 760 Torr, during the deposition. The plasma may be provided by RF power delivered to a showerhead electrode and/or a substrate support electrode of the chamber. The RF power may be provided at a power level between about 2 W and about 5,000 W at a single low frequency of between about 100 kHz up to about 1 MHz, e.g., about 300 kHz to about 400 kHz, or at a power level between about 2 W and about 5000 W at a single high frequency of about 1 MHz up to about 60 MHz. Alternatively, the RF power may be provided at a mixed frequency including a first frequency between about 100 kHz up to about 1 MHz at a power level between about 2 W and about 5000 W and a second frequency of about 1 MHz up to about 60 MHz at a power level between about 2 W and about 5000 W.

The chamber into which the boron containing precursor is introduced may be any CVD chamber or a PECVD chamber. Examples of chambers that may be used include the PRODUCER® SE and PRODUCER® GT PECVD chambers, both of which are available from Applied Materials, Inc. of Santa. Clara, Calif.

By varying the flow rates and other processing conditions within the describe ranges, the concentration of boron in the boron rich layer can be controlled. In addition to film composition, other properties of the boron rich films, such as refractive index (RI) and step coverage, can be tailored by introducing other precursors into the chamber during the introduction of the boron containing precursor. For example, additives such as $NH_3$ and $SiH_4$ can be introduced into the CVD processing chamber in combination with the boron precursor. The boron rich films deposited with $B_2H_6$, $NH_3$ and $SiH_4$ had the best step coverage. Various other additives can be used to alter the performance of the deposited boron rich layers.

Figure 2:
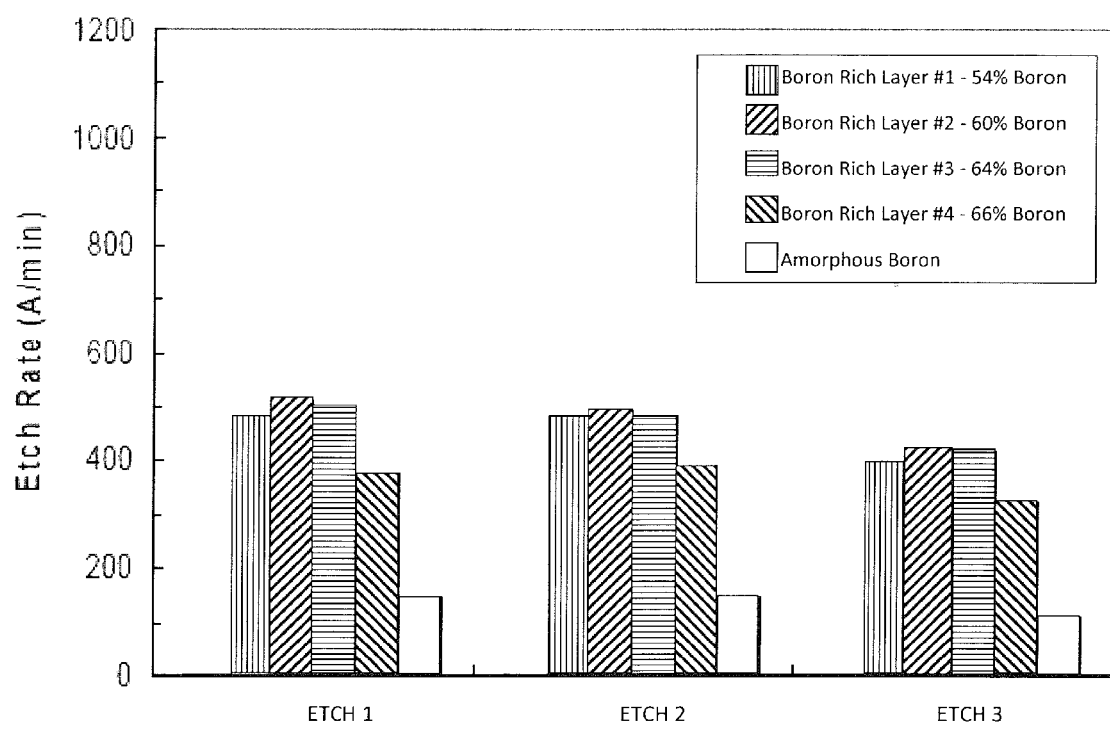
FIG. 2 is a graph illustrating etch rates for different boron rich layers that include varying percentages of boron.

In an embodiment the boron rich layer is used as a hard mask material during semiconductor fabrication. Different percentages of boron can result in different physical properties. For example, with reference to FIG. 2, a bar graph showing the etch rates of different boron rich layers is illustrated. The graph is broken up into three groups of boron containing materials that are each etched with a different fluorine process. The first etch is an low temperature oxide (LTO) plasma etch that uses the process gases, $CHF_3$ and $C_2F_6$. The second etch is an ultra low K (ULK) main etch (ME) that typically use a carbon-fluorine ($C_xF_x$) such as $CHF_3$:$CF_4$ etch chemistry. The third etch is barrier low-k (BLOK) which is typically etched with a carbon-fluorine ($C_xF_x$) such as $CF_4$.

The boron containing materials in the three groups have different concentrations of boron including: 54%, 60%, 64% and 66%. For comparison purposes, the characteristics of amorphous boron have also been charted. The height of each bar represents the etch rates of the different boron containing materials. In each group, the bars are arranged in order of increasing boron content from left (lowest boron content) to right. As the boron content increases, the etch rate tends to decrease. The etch rates for Etch 1 and Etch 2 are very similar. The etch rates are between about 480 to 520 Å/min for the boron layers having 54% to 64% boron. When the boron content is increased to 66%, the etch rates falls to about 390 Å/min. In contrast, the etch rate for amorphous boron in the same etch conditions is about 160 Å/min. For the third etch, the etch rate is about 400 to 420 Å/min for the boron layers having 54% to 64% boron, 300 Å/min for 66% boron and 100 Å/min for amorphous boron.

Figure 3:
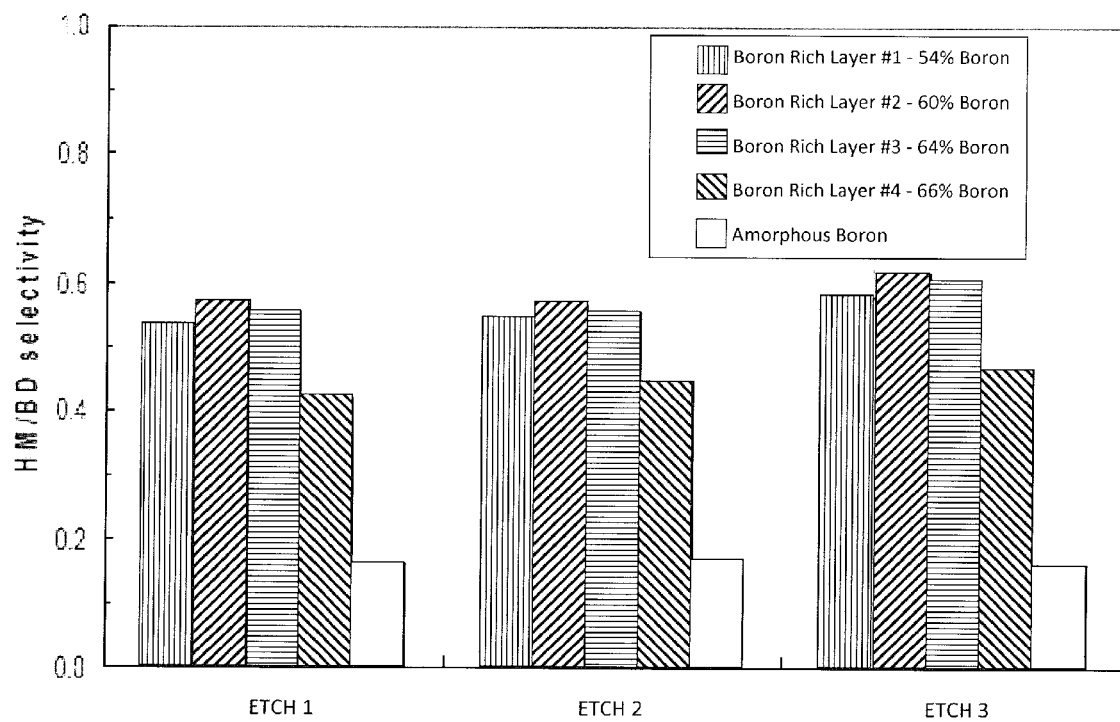
FIG. 3 is a graph illustrating etch selectivities for different boron rich layers that include varying percentages of boron.

With reference to FIG. 3, a bar graph illustrating the selectivity of the boron rich layers for three fluorine based etch processes is shown. The graph illustrates the selectivity of the boron as a number between 0 and 1 that indicates the relative etch rates of the boron rich layer and the uncovered areas of the substrate. The selectivity tends to get lower meaning that the underlying layer is etched at a higher rate than the boron rich layer. In the first two etches, the selectivity for the boron rich layer having a boron content of 54% to 64% is between 0.54 to 0.56. The selectivity for boron rich layer having 66% boron is about 0.41 and the selectivity of amorphous boron is about 0.17. For the third fluorine etch, the selectivity for the boron rich layer having a boron content of 54% to 64% is between 0.58 to 0.62 and the selectivity for amorphous boron is 0.17.

Figure 4:
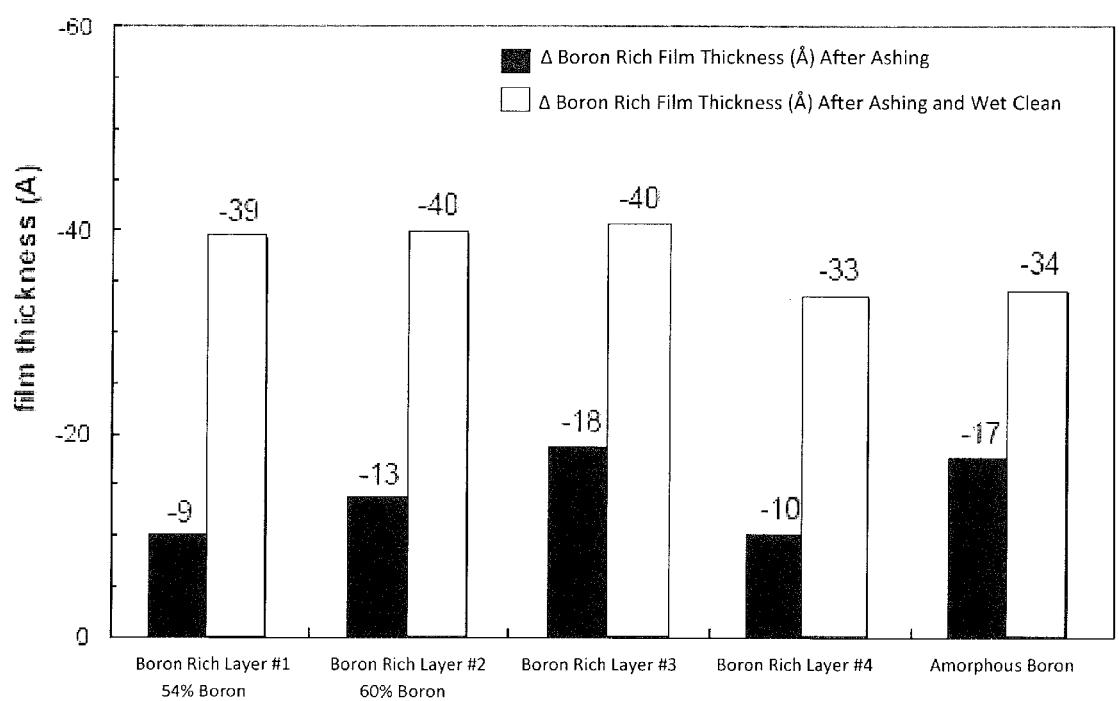
FIG. 4 is a graph illustrating the changes in film thickness after process steps for different boron rich layers that include varying percentages of boron.

With reference to FIG. 4, the boron rich layers were also measured for thickness loss after ashing and wet cleaning. The thicknesses were measured before and after ashing and wet cleaning to determine the thickness losses. The boron rich layers lost 9 Å to 18 Å due to ashing and 33 Å to 40 Å after both ashing and wet cleaning. For comparison, a 97% boron layer lost 17 Å from ashing and 34 Å from ashing and wet cleaning. Thus, the material removal characteristics of these boron rich materials are similar to amorphous boron.

The wet cleaning can be performed with solutions such as $HF:H_2O_2$, Hot $H_3PO_4$, and $H_2SO_4:H_2O_2$. With reference to Table 2, the etch rates of the boron rich materials are listed for these wet cleaning solutions. The etch rates range decrease with increases in the boron content. The etch rates of the boron rich that is 60%+ boron, have etch rates that are very similar to amorphous boron.

TABLE 1

| Properties | 54% boron | 60% boron | 64.5% boron | 66% boron | Amorphous boron |
|---|---|---|---|---|---|
| Wet Etch Rate (Å/min) | | | | | |
| $DHF:H_2O_2$ | 2.0 | <1.0 | <1.0 | <1.0 | 1.0 |
| Hot $H_3PO_4$ | 4.0 | <1.0 | <1.0 | <1.0 | 0.7 |
| SPM ($H_2SO_4:H_2O_2$) | 15 | <1.0 | 1.0 | <1.0 | 0.6 |

Figure 5:
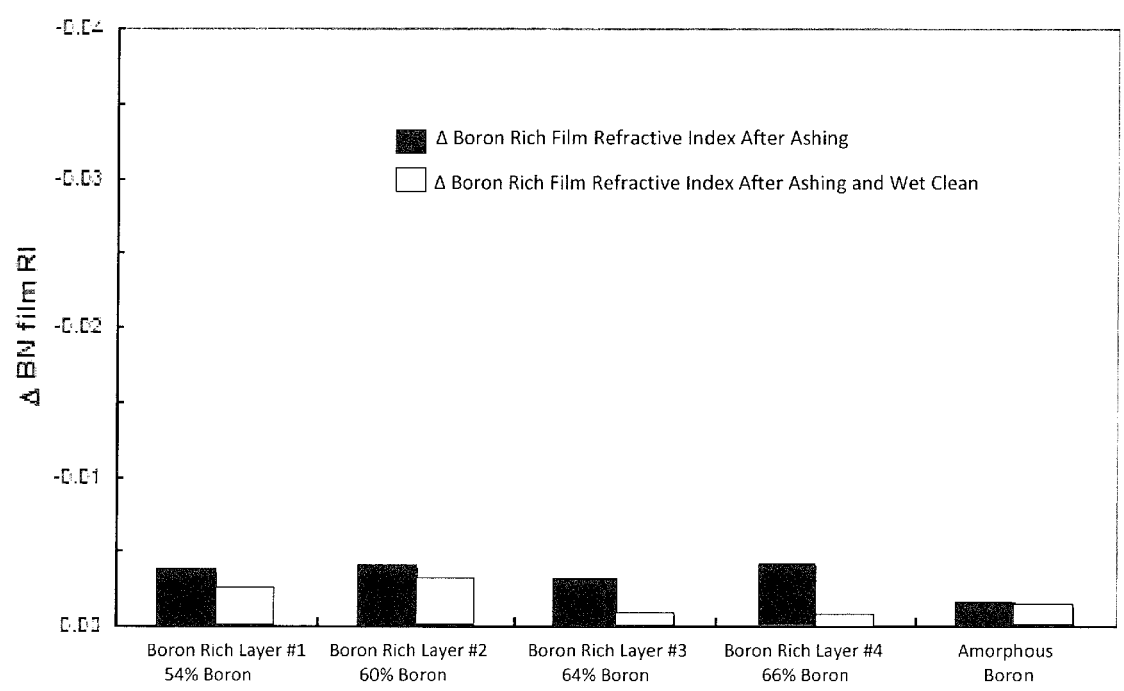
FIG. 5 is a graph illustrating the change in refractive index for boron rich layers after ashing and wet cleaning.

In addition to altering the boron rich layer thickness after ashing and wet cleaning, these processes can also alter the index of refraction of the boron rich layer. FIG. 5 is a bar graph showing the change in refractive index (RI) after ashing and wet cleaning. The refractive index remains fairly constant after processing with a change between −0.004 to −0.0045 after ashing and −0.001 to −0.004 after ashing and wet cleaning. The change in refractive index for amorphous boron of about 0.002 after ashing and about 0.0015 after ashing and wet cleaning. The differences between boron rich and amorphous boron are very small differences and not significant.

Figure 6:
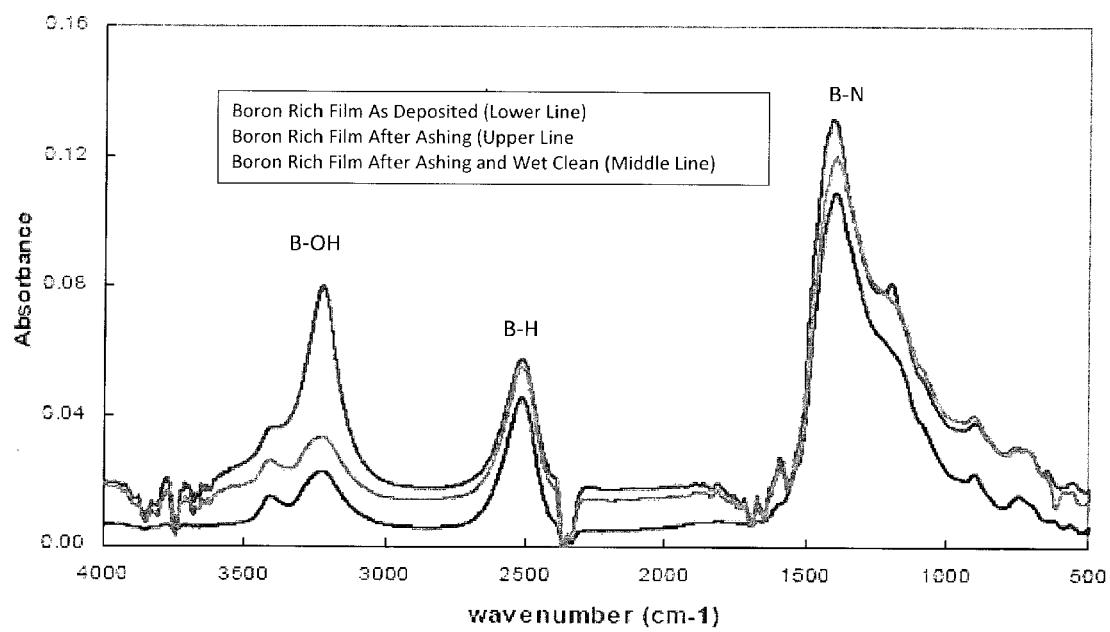
FIG. 6 is a FTIR graph that shows the material composition of the boron rich layer.

FIG. 6 is a Fourier transform infrared spectroscopy (FTIR) graph that shows the effect of ashing and wet cleaning on the material composition of the deposited boron rich layer. In this example, the deposited boron rich layer contains 54% boron. The graph shows three peeks. The left peek indicates the presence of B—OH which results from oxidation of the boron. This signal is not on the boron rich layer as deposited and is only detected after ashing. After wet cleaning the signal is again removed indicating the oxidation is removed after wet cleaning. The middle peek indicates the presence of B—H and the right indicates the presence of B—N.

Figure 7:
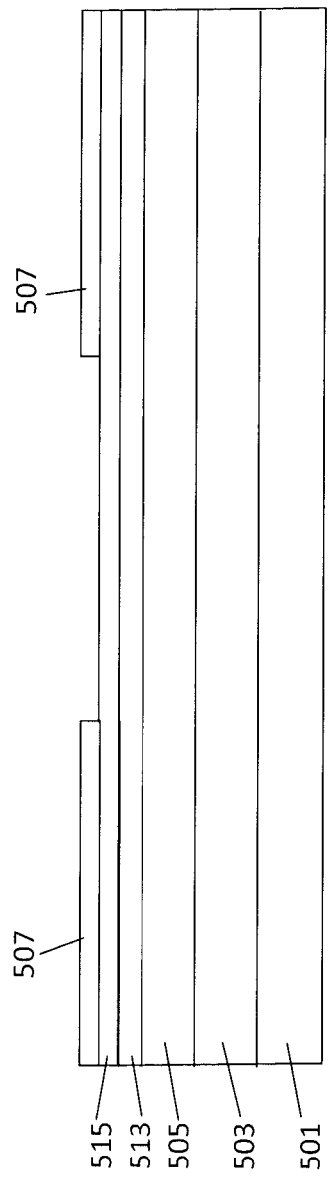
FIGS. 7-11 illustrate an etch process for a multi-layer boron rich layer.
Figure 8:
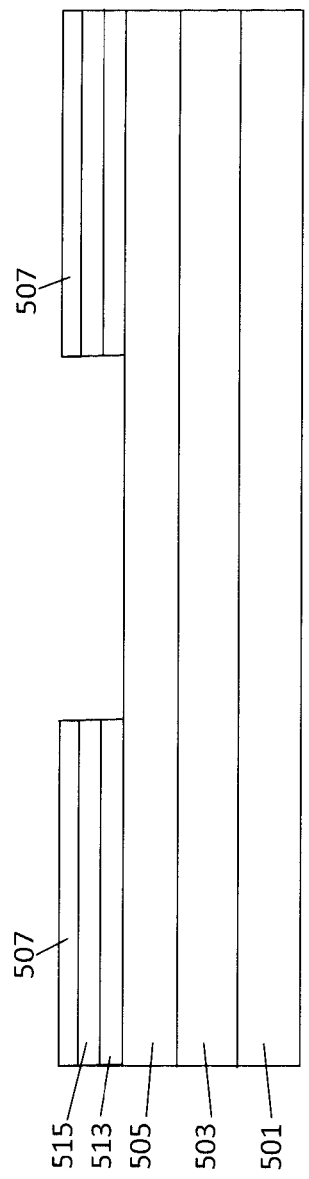
Figure 9:
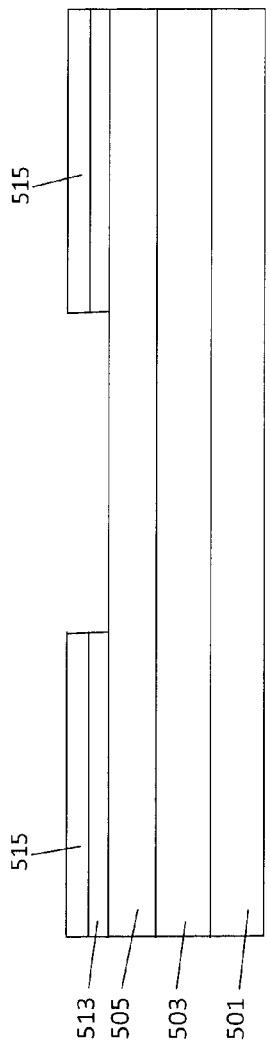
Figure 10:
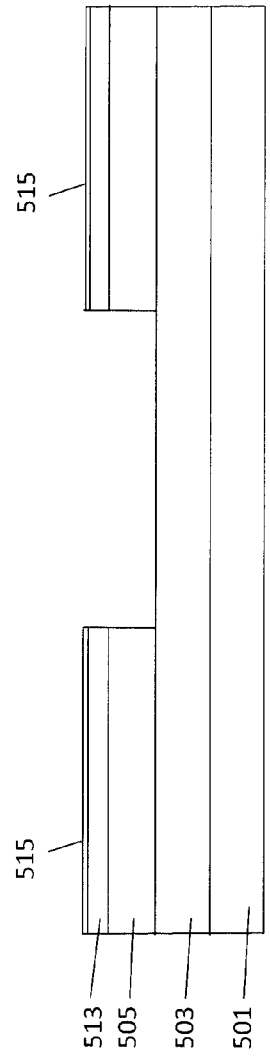
Figure 11:
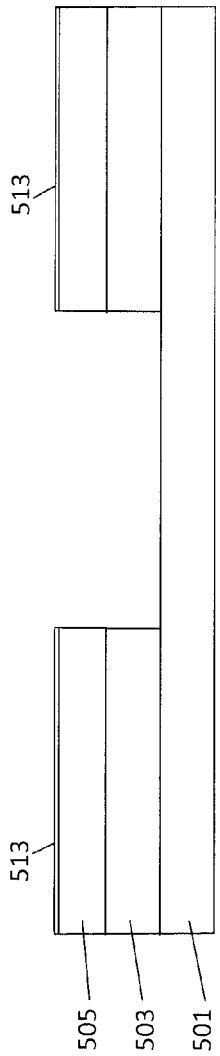

The different boron rich compositions can provide the optimum selectivity for different materials. In an embodiment, it is possible to etch a layer stack of different materials using a multiple layer boron film. The upper layer of the boron rich material can have an optimum selectivity for the upper underlying material using a first etch chemistry and the lower boron rich layer can have an optimum selectivity for the lower underlying layer using a second etch chemistry. The multiple layer etch is illustrated by FIGS. 7-11. With reference to FIG. 7, the layer stack prior to etch is illustrated. The layer stack includes a substrate 501, a lower material layer 503, an upper material layer 505, a lower boron rich layer 513 and an upper boron rich layer 515. A layer of photo resist 507 can be deposited over the upper boron rich layer 515 and patterned in a lithography process. With reference to FIG. 8, the upper boron rich layer 513 and the lower boron rich layer 515 are etched. Afterwards, the patterned photo resist 507 is removed as shown in FIG. 9. With reference to FIG. 10, the upper material layer 505 is etched with a first etch chemistry which also etches the upper boron rich layer 515. With reference to FIG. 11, the lower material layer 503 is etched with a second etch chemistry which also etches the remaining upper boron rich layer 515 and most of the lower boron rich layer 513. In other embodiments, substrates having additional layer stacks can be etched in a similar manner with multiple boron rich layers each having a different material composition.

After the etch processing is completed, the boron rich layer may be sacrificial and removed from the structure or left in structures after patterning. For example, the boron rich films that are hard masks for etching oxide, nitride, silicon, polysilicon, or metal layers can be left in the structure. The boron rich films may also be used for back end applications, such as copper barrier layers or as adhesion layers between copper and copper barrier layers, e.g., by forming CuBN, CuPBN, or CuBCSiN layers therebetween. The boron rich copper barrier layers or adhesion layers may have a dielectric constant between 1.1 and 6.5. The boron rich copper barrier layers may be used in conventional damascene structures or structures that include air gaps that are formed by depositing and then removing a sacrificial material.

Figure 12:
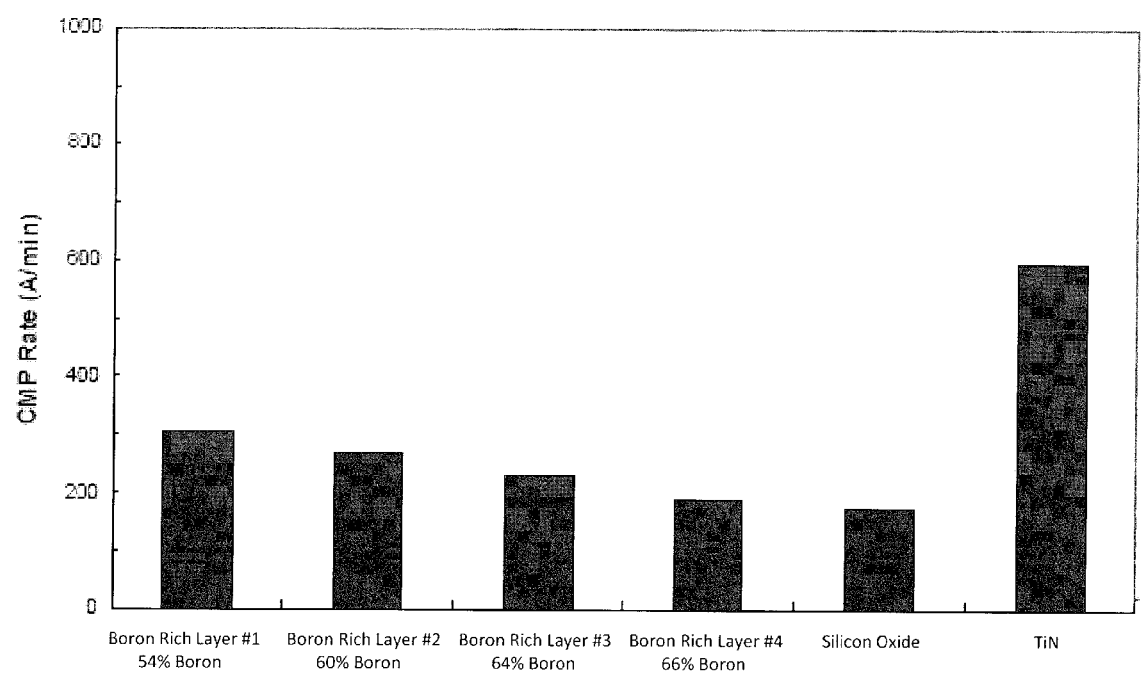
FIG. 12 is a graph illustrating the differences in CMP material removal rate between different layers that include varying percentages of boron.

In an embodiment, the boron rich layer can be removed by a chemical mechanical polishing (CMP) process. During CMP processing, the substrate is held in a rotating head and pressed against a moving CMP pad that is saturated with an abrasive slurry. The movement and pressure of the substrate against the abrasive slurry causes material to be removed from the substrate. Different materials on the substrate that are exposed to the slurry will have different etch rates. FIG. 12 is a graph illustrating the material removal rate of the boron rich material during CMP processing. In this example, the CMP etch rate for boron rich having 54% boron is 310 Å/min, 60% boron is 280 Å/min, 64% boron is 250 Å/min and 66% boron is 200 Å/min. The rate of material removal decreases as the percentage of boron in the boron rich layer increases. In addition to the boron rich materials, the graph also illustrates that TiN has an etch rate that is 600 Å/min which is a much higher CMP material removal rate than any of the boron rich layers tested.

Figure 13:
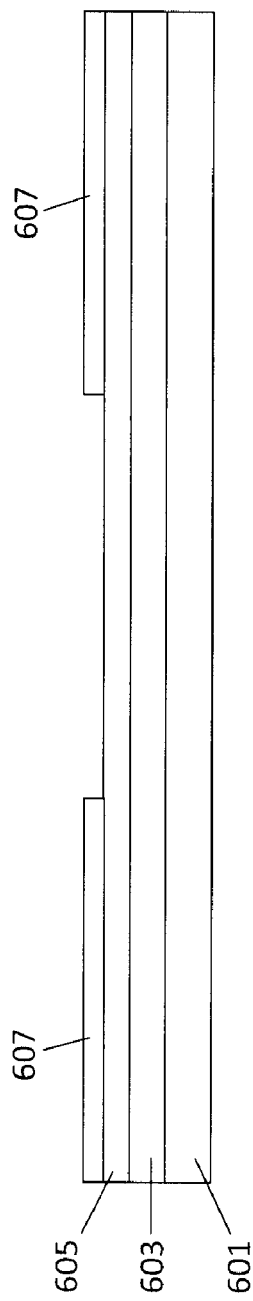
Figure 14:
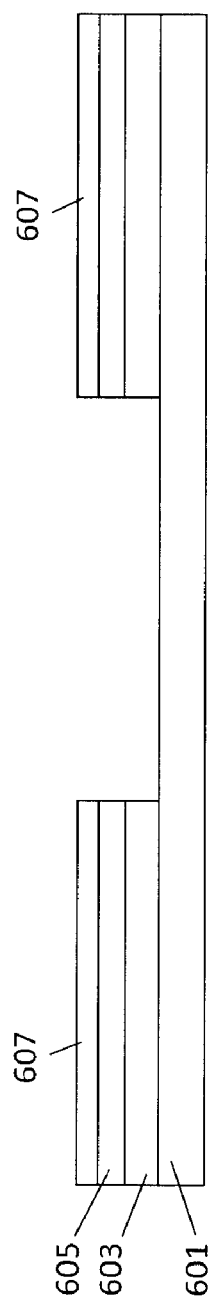
Figure 15:
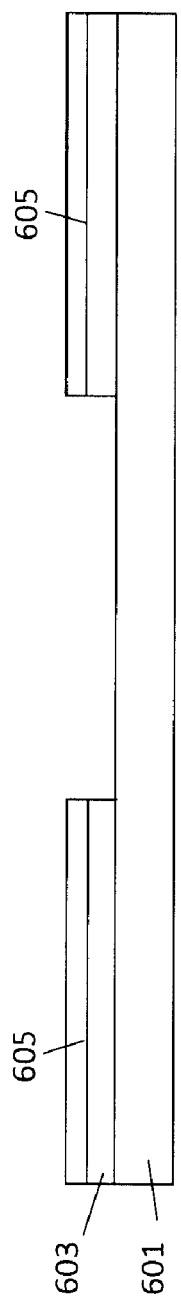

With reference to FIGS. 13-17, the steps for CMP processing with the boron rich layer are illustrated. With reference to FIG. 13, a substrate 601 having a dielectric layer 603, a boron rich layer 605 and a patterned photo resist layer 607. With reference to FIG. 14, the boron rich layer 605 is etched. With reference to FIG. 15, the photo resist layer 607 is removed and the dielectric layer 603 is etched. With reference to FIG. 16, a conductive material 609 such as copper is deposited over the boron rich layer 605 filling the etched portions of the dielectric layer. With reference to FIG. 17, the boron rich layer 605 and the conductive material 609 are planarized with a CMP process until the boron rich layer is removed and the conductive material 609 is flush with the dielectric layer 603.

In some embodiments, additional processing can be performed on the boron rich layer. In some cases, the deposited boron rich film can have a high stress level. The stress level may be proportional to the boron content of the film with a higher boron content creating a higher stress level. A possible method for relieving the stress is to control the temperature of the deposition. The stress of the boron rich film can be very high tensile stress at 300° C. and reduced as the temperature increases. At a deposition temperature greater than about 480° C., the stress becomes compressive. By depositing the boron rich layer close to this transition point, the stress can be minimized. In other embodiments, post deposition processes can be performed to reduce the stress. For example, an ultra violet (UV) cure or plasma processing with argon, helium or xenon can be applied to the entire boron rich film after a specific thickness of the film has been deposited. For example, these treatments can be applied after a boron rich film thickness of 5 to 50 angstroms has been deposited. The UV cure tends to make the boron rich film stress more tensile, so if the film is deposited at a temperature above 480° C. with compressive stress, the UV cure will make the film less compressive.

One will appreciate that in the description above and throughout, numerous specific details are set forth in order to provide a thorough understanding of the present invention. It will be evident, however, to one of ordinary skill in the art, that the present invention may be practiced without these specific details. In other instances, well-known structures and devices are shown in block diagram form to facilitate explanation. The description of the preferred embodiments is not intended to limit the scope of the claims appended hereto.

What is claimed is:

1. A method of processing a substrate, comprising:
   a) placing the substrate into a processing chamber;
   b) introducing a boron containing precursor into the chamber;
   c) heating the substrate, the boron containing precursor and a nitrogen containing precursor to above 300° C.;
   d) thermally reacting the boron containing precursor;
   e) depositing a boron rich film as a homogeneous material on the substrate, the boron rich film having at least 60% boron;
   f) forming a patterned photo resist layer over the boron rich film;
   g) etching the boron rich film in a pattern corresponding with the patterned photo resist layer;
   h) etching the pattern into the substrate; and
   i) depositing a material in etched portions of the boron rich film.

2. The method of claim 1 further comprising:
   repeating steps (b)-(e) until a predetermined thickness of the boron rich film is formed.

3. The method of claim 2 wherein multiple layers of the boron rich film are formed and each of the layers of the boron rich film has a different material composition.

4. The method of claim 1 comprising the further step of:
   j) planarizing the material with a chemical mechanical polishing process until the material is flush with the substrate and the boron rich film is removed.

5. The method of claim 1 comprising the further step of:
   k) relieving the stress of the deposited boron rich film.

6. The method of claim 1, wherein the boron containing precursor includes hydrogen.

7. The method of claim 1, wherein the boron-containing precursor is $B_2H_6$.

8. The method of claim 1, wherein the boron-rich films contains between about 1% to 40% of one or more of the following: hydrogen, oxygen, carbon or nitrogen.

9. A method of processing a substrate, comprising:
   a) placing the substrate into a processing chamber;
   b) forming a first layer on the substrate and a second layer over the first layer;
   c) introducing a boron containing precursor into the chamber;
   d) heating the substrate, the boron containing precursor to above 300° C.;
   e) thermally reacting the boron containing precursor;
   f) depositing a first boron rich film on the second layer;
   g) repeating the introducing, the heating and the thermally reacting steps;
   h) depositing a second boron rich film on the first boron rich film having a different material composition than the first boron rich film;

i) forming a patterned photo resist layer over the second boron rich film;
j) etching the first boron rich film and the second boron rich film in a pattern corresponding with the patterned photo resist layer;
k) etching the pattern into the substrate; and
l) depositing a material in etched portions of the first boron rich film.

10. The method of claim 9, wherein the etching the first boron rich film and the second boron rich film includes,
etching the second layer in the pattern to expose the first layer with a first etch chemistry; and
etching the first layer in the pattern with a second etch chemistry that is different than the first etch chemistry.

11. The method of claim 9, comprising the further steps of:
m) removing most of the second boron rich layer during the etching of the second layer.

12. The method of claim 11, comprising the further step of:
n) removing most of the first boron rich layer during the etching of the first layer.

13. The method of claim 9, wherein the boron-containing precursor includes hydrogen.

14. The method of claim 13 wherein the boron containing precursor is $B_2H_6$.

15. The method of claim 9, comprising the further step of:
o) relieving the stress of the deposited boron rich film.

16. The method of claim 15, wherein the relieving the stress includes ultra violet or plasma processing of the boron rich film.

17. The method of claim 9, wherein the first boron rich film and the second boron rich film have a boron content greater than 60%.

* * * * *